United States Patent [19]

Powell

[11] Patent Number: 5,790,614

[45] Date of Patent: Aug. 4, 1998

[54] SYNCHRONIZED CLOCK USING A NON-PULLABLE REFERENCE OSCILLATOR

[75] Inventor: William E. Powell, Raleigh, N.C.

[73] Assignee: Alcatel Network Systems, Inc., Richardson, Tex.

[21] Appl. No.: 675,649

[22] Filed: Jul. 2, 1996

Related U.S. Application Data

[62] Division of Ser. No. 74,108, Jun. 9, 1993, abandoned.

[51] Int. Cl.$^6$ ................................................. H03D 3/24
[52] U.S. Cl. ............................ 375/376; 331/25; 331/18
[58] Field of Search ................................ 375/376, 373, 375/327; 331/25, 1 A, 18; 327/150, 146, 147, 156, 159; 455/260

[56] References Cited

U.S. PATENT DOCUMENTS

| | | | |
|---|---|---|---|
| 3,959,737 | 5/1976 | Tanis | 331/1 |
| 4,030,045 | 6/1977 | Clark | 375/376 |
| 4,107,612 | 8/1978 | Leveque | 325/171 |
| 4,802,009 | 1/1989 | Hartmeier | 358/158 |
| 4,849,993 | 7/1989 | Johnson et al. | 375/108 |
| 4,866,739 | 9/1989 | Agazzi et al. | 375/106 |
| 4,868,524 | 9/1989 | Costlow et al. | 331/16 |
| 4,893,094 | 1/1990 | Herold et al. | 331/1 |
| 4,933,955 | 6/1990 | Warren et al. | 375/20 |
| 5,018,170 | 5/1991 | Wilson | 375/120 |
| 5,052,031 | 9/1991 | Mollog | 375/120 |
| 5,070,310 | 12/1991 | Hietala et al. | 331/1 |
| 5,304,956 | 4/1994 | Egan | 331/10 |
| 5,349,310 | 9/1994 | Rieder et al. | 331/18 |

OTHER PUBLICATIONS

"Digital Clock Distributor", DCD-419:2/Introduction, Telecom Solutions 1992.
SUPERCOMM ICC '92 Network Synchronization Workshop; Handout entitled "Introductions to Clocks—Architectures Old ST3 vs. New ST3-E" by Tony Warren.
Application Note 412, Issue 2, dated Mar. '92, Telecom Solutions ST3-E.

"Digital PLL Frequency Synthesizers—Theory and Design", U. Rohde, Prentice-Hall, Inc., Englewood Cliffs NJ, pp. 124-125, 128-129, 132-133, 136-137 and 140-141.

85 MHz Direct Digital Synthesizer nAD9955, Specification Sheets, Analog Devices, Rev. 0, Oct. 1992.

AN-237 Application Note, "Choosing DACs for Direct Digital Synthesis", Analog Devices, Jul. 1992.

"Neue Taktgeneratoren fur EWSD", Ernst et al, Telecom Report 9 (1986), Brodhure 4, pp. 263-269.

Primary Examiner—Stephen Chin
Assistant Examiner—Betsy L. Deppe
Attorney, Agent, or Firm—Ware, Fressola, Van Der Sluys & Adolphson LLP

[57] ABSTRACT

Digital signal processing techniques are used to synthesize a range of output frequencies locked to a non-pullable reference oscillator, and the synthesized output frequency is used in a slave low bandwidth phase-locked loop; by increasing digital resolution in a phase accumulation register, any desired resolution of output frequencies can be generated. The range of output frequencies is synthesized in such a way as to generate only high-frequency jitter, which can be easily filtered by follow-on, low-cost, relatively high bandwidth phase-locked loops which are typically needed for frequency multiplication in a given system. The magnitude of residual jitter is easily controlled by proper choice of the non-pullable oscillator reference frequency, the output frequency range to be synthesized and various other digital factors, such as divider ratios. Improved noise performance is achieved while still maintaining a wide pulling range of the composite phase-locked loop.

4 Claims, 9 Drawing Sheets

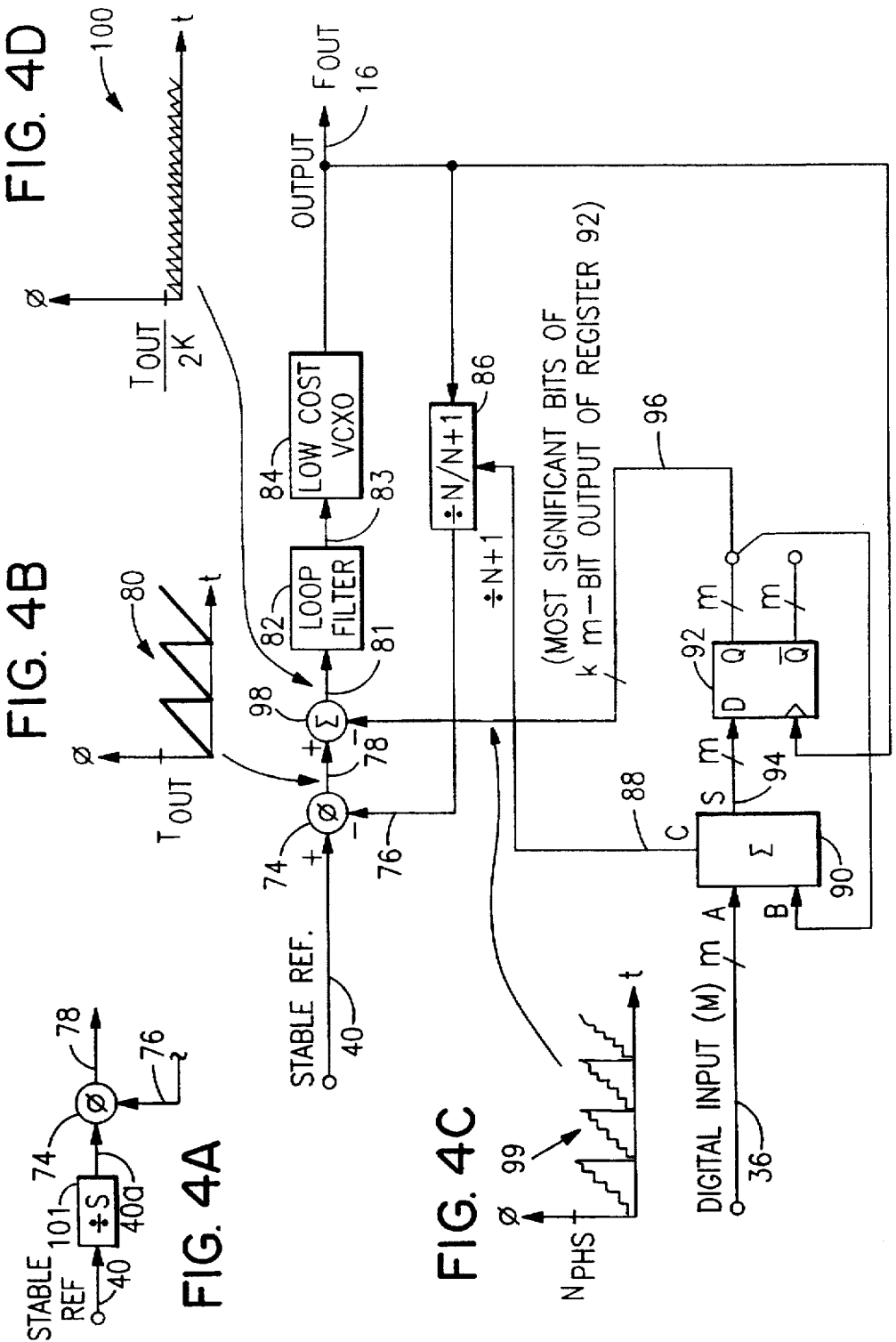

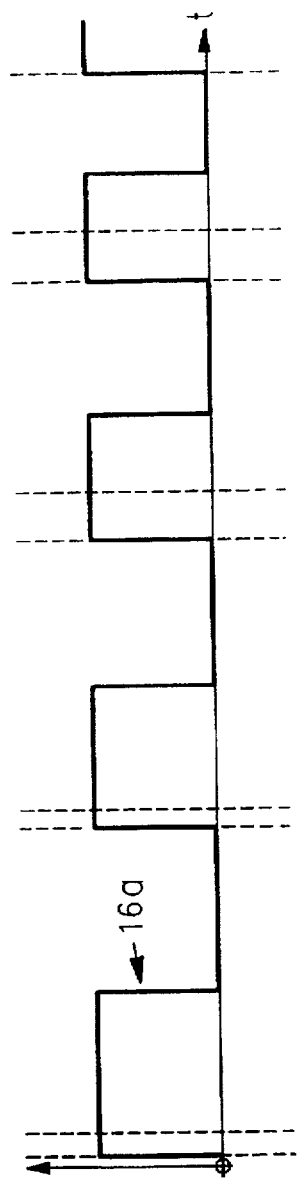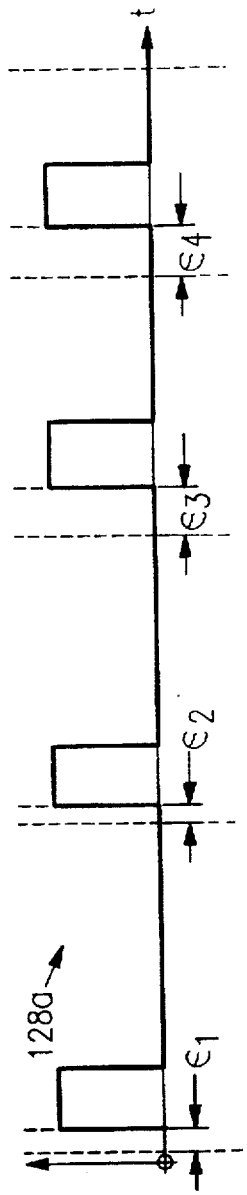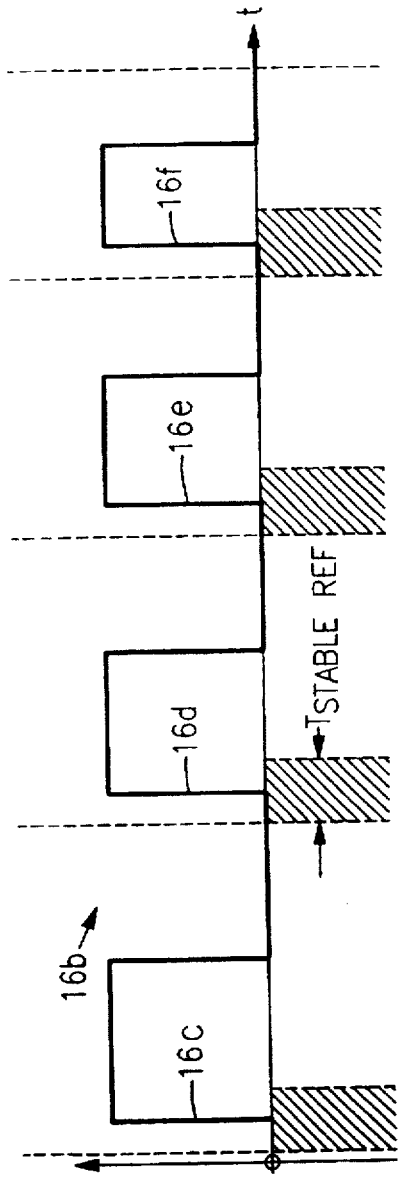

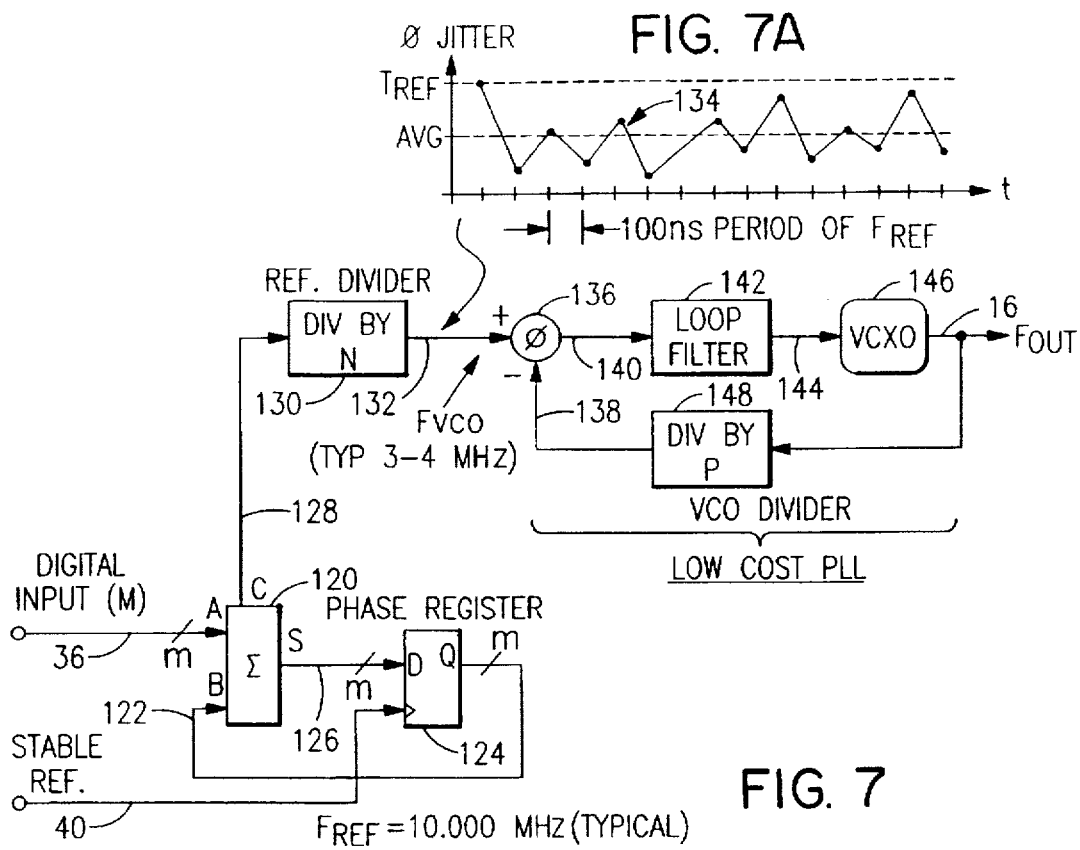
FIG. 7A
FIG. 7
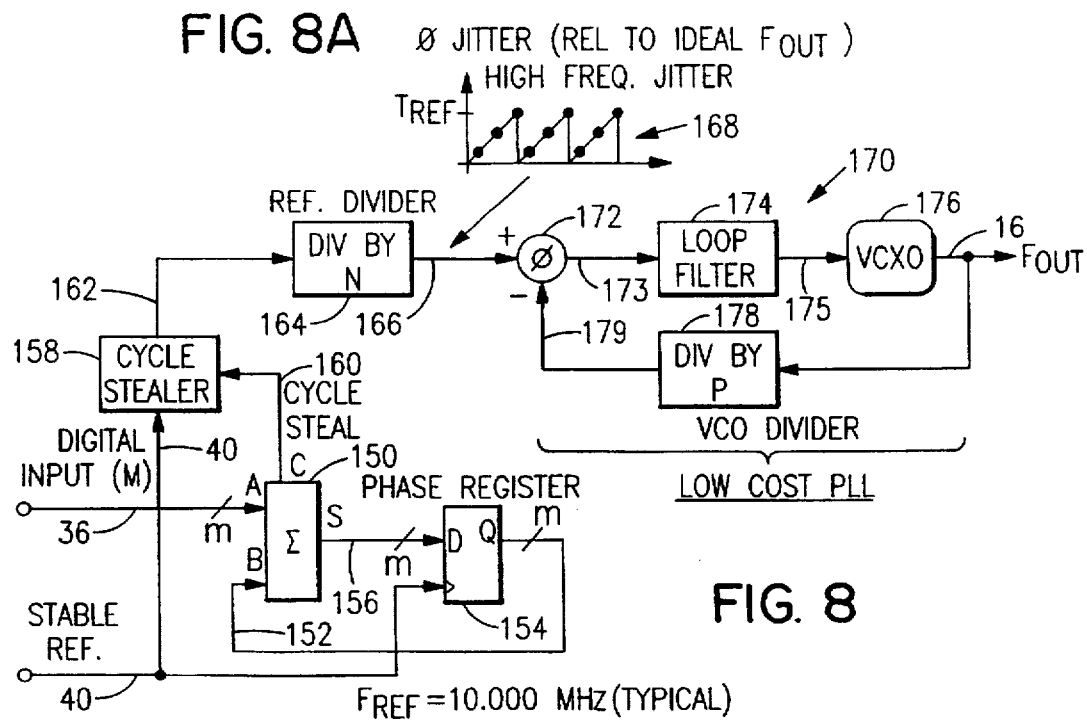
FIG. 8A
FIG. 8

SYNCHRONIZED CLOCK USING A NON-PULLABLE REFERENCE OSCILLATOR

This is a divisional of application Ser. No. 08/074,108 filed on Jun. 9, 1993, abandoned.

TECHNICAL FIELD

The present invention relates to networks having plural interconnected network elements and to synchronizing a local clock in a network element to a line clock from another network element.

BACKGROUND OF THE INVENTION

A receiver clock can be synchronized to a transmitted line clock using a phase detector in a phase-locked loop which continuously measures the phase difference between the line clock and the local clock. The phase difference between the incoming line clock and the local clock is filtered by a lowpass filter to eliminate noise and other high-frequency components and the filtered error signal is then used to adjust the frequency of a voltage-controlled oscillator (VCO) which constitutes the local clock, used as a feedback signal into the phase detector to allow locking of the local VCO to the frequency and phase of the incoming reference.

Unfortunately, the VCO will have a certain amount of instability including phase and frequency instability, i.e., the rate at which the output frequency changes from being too high to being too low. A slow variation, typically less than 10 Hertz is called wander while more rapid phase instability is called jitter. There are of course other sources of instability manifesting themselves as wander and jitter in a network.

With regard to the noise that passes through the phase detector and the filter, such will cause erroneous adjustments in the VCO frequency. These will be manifested by phase shifts that build up over time and can be detected by the phase-locked loop described above. The local clock maintains the desired average frequency but inherently produces short-term variations of phase and frequency as it wanders or jitters about the frequency and phase of the incoming line clock.

It is often desirable for the phase-locked loop to have a lowpass filtering bandwidth with a very low cutoff frequency to eliminate as much external noise and interference as possible, to allow accurate long-term tracking of the external reference frequency. However, too low a bandwidth will prevent fast correction of a drifting or noisy VCO. A wider bandwidth phase-locked loop is then usually required which unfortunately prevents elimination of all of the external disturbances that one might like to filter out. Nevertheless, the phase-locked loop does in fact filter out external disturbances on the reference input for noise components with frequencies higher than the bandwidth of the loop itself.

Previous conventional clock and low bandwidth digital phase-locked loop (PLL) designs have typically used a combination of a digital-to-analog converter (DAC) and a voltage-controlled crystal oscillator (VCXO).

The use of a VCXO degrades short term stability (Allan Variance, Time Deviation) and long term stability (daily aging and lifetime accuracy) over what could be achieved with the same resonator in a higher Q, fixed frequency (non-pullable) oscillator. A non-pullable oscillator would also have lower noise. The use of a DAC is also undesirable due to its analog nature, cost, board space, accuracy drift, and relatively low resolution (8–16 bits is typical).

The question naturally arises, how can one possibly use a fixed-frequency oscillator with high Q in an application that demands variable frequency to compensate for reference input frequency variations and fixed-frequency oscillator aging and temperature drift.

DISCLOSURE OF INVENTION

An object of the present invention is to provide improved local clock and low bandwidth phase-locked loop short term stability and pulling range.

Another object of the invention is to reduce parameter variations, thereby allowing a wider bandwidth/lower noise design for a given filtering bandwidth requirement.

Still another object of the invention is to lower cost by eliminating the need for a voltage-controlled crystal oscillator and a digital-to-analog converter in a digital phase-locked loop and by substituting a design that can be incorporated in an Application-Specific Integrated Circuit (ASIC).

According to the present invention, digital signal processing techniques are used to synthesize a finely spaced range of output frequencies locked to a non-pullable reference oscillator and using this technique in a slave, low-bandwidth, phase-locked loop. Any desired resolution or range of output frequencies can easily be generated using this technique by increasing digital resolution in the digital calculation apparatus or synthesizer.

In further accord with the present invention, the range of output frequencies is synthesized in such a way as to generate jitter which is essentially only high-frequency in nature, which can be easily removed by follow-on, low-cost, relatively high-bandwidth PLLs which are typically needed for frequency multiplication in a network element or system. The magnitude of residual jitter is easily controlled by proper choice of the non-pullable oscillator reference frequency, the output frequency range to be synthesized, and various other digital factors such as specialized dividers and divide ratios.

The advantages of the present invention include approximately a twenty-five per cent lower reference oscillator cost, a five to ten times improvement in output MTIE and short term stability (TDEV), orders of magnitude improvement in frequency resolution, significant reduction in overall low bandwidth PLL cost/board space (if an ASIC is used), allowing the use of a small number of standardized frequency reference oscillators for several applications. Design flexibility is provided wherein critical parameters can be made programmable, for example, where one Application Specific Integrated Circuit (ASIC) could serve many diverse phase/frequency locking applications, providing significant improvement in accuracy and short term stability (MTIE, TDEV). For the highest cost/space savings, it requires integration in an ASIC or programmable logic device, and for optimum performance, requires simulation before final choices are made for digital divide ratios and/or the choice of the reference oscillator frequency.

These and other objects, features and advantages of the present invention will become more apparent in light of the detailed description of a best mode embodiment thereof, as illustrated in the accompanying drawing.

BRIEF DESCRIPTION OF THE DRAWING

FIG. 4 shows a frequency synthesizer, according to the present invention, which may be used as the frequency synthesizer of FIG. 1;

FIG. 4A shows a modification of the circuit of FIG. 4;

FIG. 4B shows an error signal waveform indicative of the phase difference between a stable reference and a feedblock signal;

FIG. 4C shows an output phase error waveform from a phase accumulation register;

FIG. 4D shows a sawtooth phase error waveform indicative of the difference between the signals of FIGS. 4B and 4C.

FIG. 6(a)–(e) is a stylized illustration, for teaching purposes, showing various waveforms on a common timeline of some of the signals in FIG. 5 and also in FIG. 7 below;

FIG. 7 shows another frequency synthesizer, according to the present invention, which may be used as the frequency synthesizer of FIG. 1;

FIG. 7A shows the output of the divider of FIG. 7 with some superimposed phase jitter;

FIG. 8 shows yet another frequency synthesizer, according to the present invention, which may be used as the frequency synthesizer of FIG. 1;

FIG. 8A shows phase jitter superimposed on the output of the reference divider of FIG. 8;

BEST MODE FOR CARRYING OUT THE INVENTION

Figure 1:
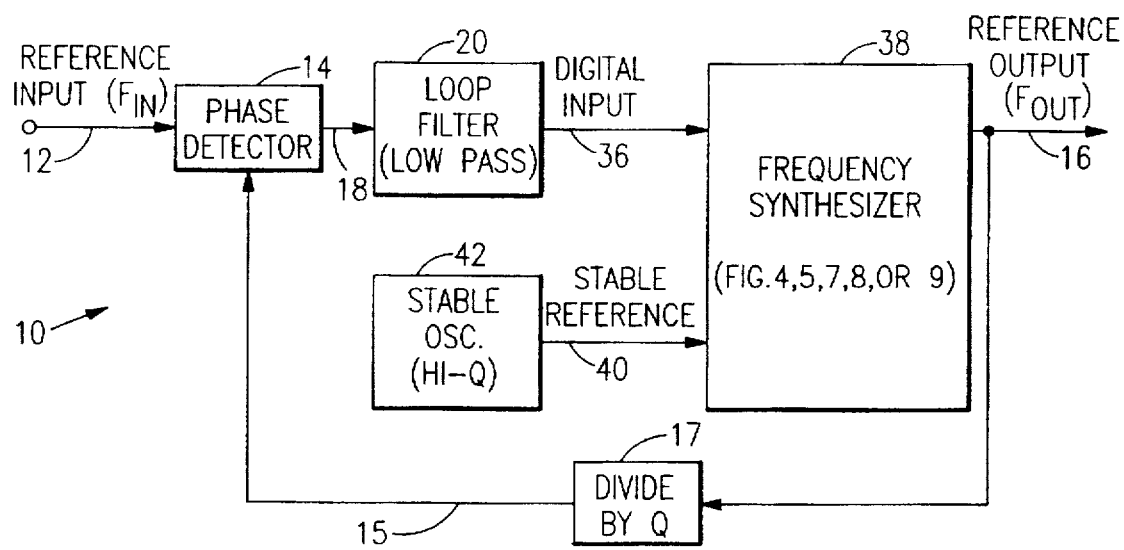
FIG. 1 shows a low bandwidth phase-locked loop, according to the present invention.

FIG. 1 shows a low bandwidth, digital, phase-locked loop 10 according to the present invention. A digital reference input signal on a line 12 having a nominal frequency ($F_{IN}$) is provided to a phase comparator 14 which is also responsive to a signal on a line 15 which is a divided version of an output signal on a line 16 having a frequency ($F_{OUT}$). A divide by Q circuit 17 is shown responsive to the output signal on the line 16 for providing a lower-frequency ($F_{OUT}/Q$) version thereof on the line 15, to match the input signal $F_{IN}$ on the line 12. Of course, it should be realized that the divide by Q circuit 17 need not be present so that the output signal on line 16 and the signal on line 15 could be the same. To the same effect, the divide by Q divisor value could be Q=1.

The input reference signal on the line 12 may represent an incoming network line signal frequency while the output signal on the line 16 may represent a local clock signal which must be synchronized to the input reference signal on the line 12, both for local purposes and for the purpose of passing on network intelligence to other network elements, each having their own local clock which must be closely synchronized to the network.

The phase comparator 14 provides an error signal on a line 18 to a lowpass filter 20 which filters out high frequency disturbances such as noise and stores a representation of the long-term average frequency of the input signal. It should be realized that, in practice, the filter 20 need not be a simple single pole lowpass filter but might in reality be a complex lead-lag filter.

Figure 2:
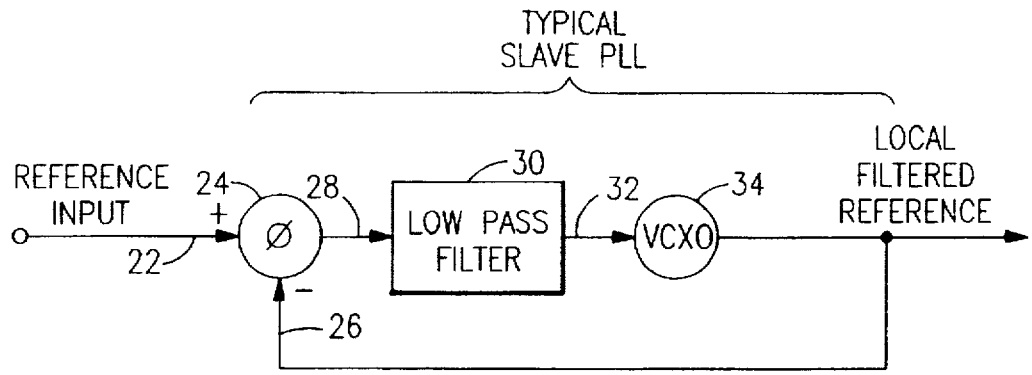
FIG. 2 shows a prior art slave analog phase-locked loop.

A low bandwidth phase-locked loop already known in the prior art is shown in FIG. 2. There, an incoming reference input clock on a line 22 is compared in a phase detector 24 to a local clock signal on a line 26 for providing an error signal on a line 28. A lowpass filter 30, similar to the filter 20 of FIG. 1, is responsive to the error signal on the line 28 and provides a filtered signal on a line 32 to drive a voltage-controlled oscillator (VCO) or voltage-controlled crystal oscillator (VCXO) 34 which may be a low cost analog type device that responds to different voltage levels with corresponding frequency changes in the local clock signal on the line 26.

According to the present invention, FIG. 1, unlike FIG. 2, provides a digital error signal on a line 36 from the filter 20 to a frequency synthesizer 38 that is also responsive to a very stable clock signal on a line 40 from a stable oscillator 42 having a high stability or a high quality factor. Such a stable oscillator is sometimes called a non-pullable reference oscillator. The frequency synthesizer 38, according to the present invention, will be described in detail below in connection with alternative embodiments shown in FIGS. 4, 5, 7 or 8. Each provides the output signal on the line 16 having improved short term stability and pulling range and capable of very fine frequency resolution.

Figure 3:
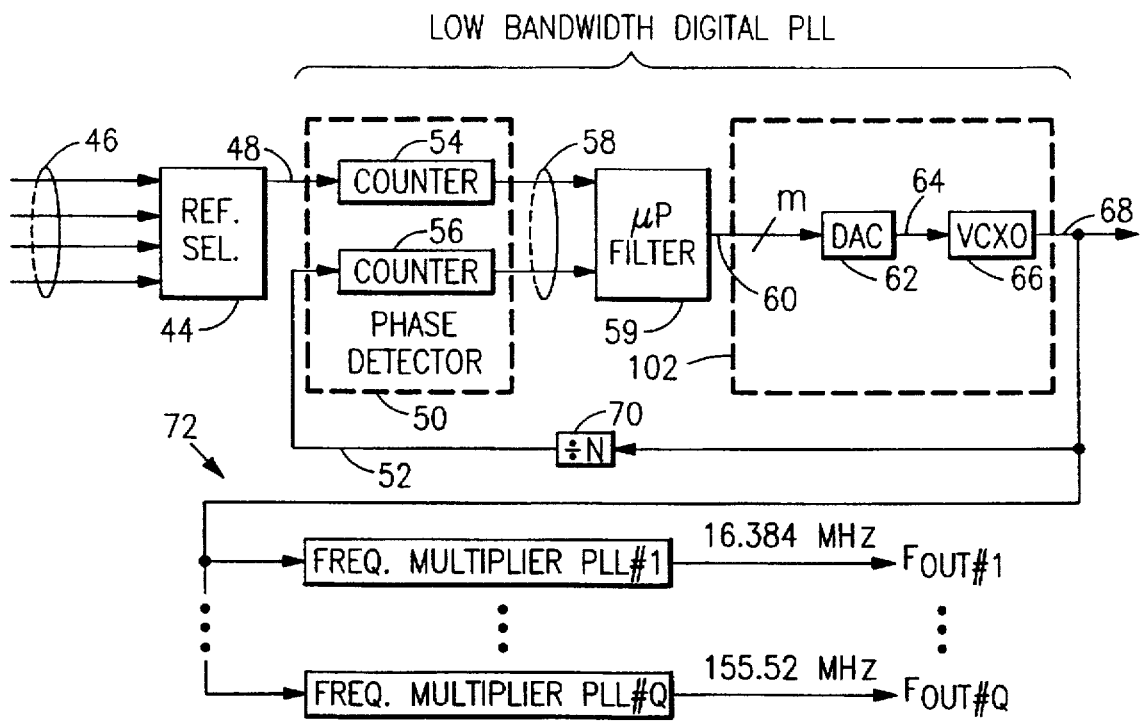
FIG. 3 shows a prior art low bandwidth digital phase-locked loop.

It should be realized that the prior art phase-locked loop of FIG. 2 which was described in analog terms can also be embodied in a digital format such as shown in the prior art low bandwidth digital phase-locked loop of FIG. 3. There, a reference selector 44 may be provided and may be responsive to a plurality 46 of possible digital input reference signals. Assuming a selection mechanism (not shown) that selects one of the plurality of signals and provides a digital reference input signal on a line 48, a phase detector 50 will be responsive to both the selected reference input signal on the line 48 and a divided output signal on a line 52 for counting the two signals in counters 54, 56 and providing counted output signals on lines 58, as shown. The difference in the two counts in the counter 54, 56 is representative of the phase difference between the input signals 48, 52 thereto. A filter 59 which may be carried out in software, provides a lowpass function such as performed by the analog lowpass filter 30 shown in FIG. 2. A lowpass filtered output signal on a line 60 having m-bit resolution is provided to a digital-to-analog converter 62 which provides an analog control signal to a voltage-controlled crystal oscillator (VCXO) 66 which in turn provides an output signal on a line 68 synchronized with the input signal on the line 48. A divider 70 is responsive to the output signal on the line 68 and may be used to divide it by a selected number "N" in order to provide the signal on the line 52 as a lower-frequency sub-multiple of the signal on the line 68. If the signal on the line 48 is at a particular reference frequency and the signal on the line 68 is at a frequency which is N times that of the particular reference frequency then the divider 70 will provide the signal on the line 52 at about the same frequency (with phase error) as the particular reference frequency on the line 48.

It should be realized that the phase detector 50 and microprocessor filter 59 of FIG. 3 could be the chosen implementation for the phase detector 14 and filter 20 of FIG. 1, respectively.

Referring back to FIG. 3, output signal on the line 68 may be used locally to drive a number of frequency multipliers 72 for providing different frequencies at the local network element, for example, as shown, and all referenced to this filtered output signal.

To reiterate what was said before in the Background of the Invention Section, it should be understood that the low bandwidth digital phase-locked loop of FIG. 3 contains a digital-to-analog converter that can be quite costly and therefore usually of relatively low resolution (8–16 bits being typical) and as such suffers from accuracy drift and typically occupies significant circuit board space. Moreover, the use of a VCXO degrades short term stability (typically measured with Allan Variance and Time Deviation statistics) and long term stability (daily aging and lifetime accuracy) over what could be achieved with the same resonator in a higher Q, fixed frequency (non-pullable) oscillator. Again, the question naturally arises, how can one possibly use a fixed frequency oscillator with high Q in an application that demands variable frequency to compensate for reference input frequency variations and fixed frequency oscillator aging and temperature drift.

According to the present invention, as shown in FIG. 1, a frequency synthesizer 38 such as shown in various examples in FIGS. 4, 5, 7 or 8 may be constructed within the loop in such a way that it is responsive to a stable oscillator 42 for providing the output signal on the line 16 with a high degree of short term stability and with improved pulling range and frequency resolution over that which is possible with the prior art digital approaches such as shown in FIG. 3.

As mentioned above in the Disclosure of Invention section, the basic idea of the present invention is to use digital signal processing techniques to synthesize a range of output frequencies locked to a non-pullable reference oscillator and to use this technique in a slave, low-bandwidth phase-locked loop.

As shown in FIG. 4, according to an embodiment of the present invention, a fractional-N synthesizer is shown that allows the synthesis of a wide range of frequencies with high resolution from a single source. Everything that is in FIG. 4 represents a frequency synthesizer such as the synthesizer 38 of FIG. 1. The circuitry of FIG. 4 itself is not new; only the use to which such circuitry is put, as shown herein, is new. For an example of an old use of the circuitry of FIG. 4, reference is made, for example, to *Digital PLL Frequency Synthesizers*, by U. Rohde at pp. 124–141 and especially FIG. 3–18 at page 133. Reference is also made to U.S. Pat. No. 3,959,737, referred to at page 141 of the Rohde book. Shown in FIG. 4 is such a new use, wherein the signal on the line 36 of FIG. 1, being the output of the lowpass filter 20 and the stable reference on the line 40 are provided to the circuitry of FIG. 4. Of course, it should be realized that the input shown on the line 36 in FIG. 4 may be similar to the input on the line 60 as shown in FIG. 3, from the microprocessor filter 59. As such, the digital input value on the line 36 of FIG. 4 may represent a particular output frequency on the line 16 which, when scaled by a divider 70, as in FIG. 3, is synchronous with a selected reference on the line 48.

Referring back to FIG. 4, the output of the stable oscillator on the line 40 is provided to a phase detector 74 which is also responsive to a feedback signal on a line 76 for providing an error signal on a line 78 which may have a waveform 80 as shown in a graph of phase error versus time shown as FIG. 4B. The phase-locked loop of FIG. 4 has a loop filter 82 and a VCXO 84 as in earlier designs discussed above, but also has a divider 86 which divides by N for all cases except when a carry signal is present on a line 88 from an adder 90, in which case the output signal on the line 16 is divided by N+1 instead of N.

The rate of increase of phase error or the slope of the sawtooth ramp of waveform 80, and the period of the sawtooth will depend on the instantaneous difference in frequencies and phase between the signals on the lines 40 and 76, which in turn influence the rate at which the divider 86 divides by N+1 instead of N. In waveform 80, the increasing ramp portion of the sawtooth represents periods in which the divider 86 is dividing by N. The edge discontinuity where the sawtooth peaks and jumps back to the time axis represents an instant in which the divider 86 divides by N+1. The idea of dividing by N most of the time and by N+1 some of the time is to allow the output frequency on the line 16 to be fractionally divided and the quotient of the fractional division to be compared to a stable reference. Depending on the frequency at which the divider 86 divides by N+1, the output frequency of the phase-locked loop will vary with fine resolution, which is also referenced to the very stable reference signal on the line 40.

A phase accumulation register may be comprised of the adder 90 having an m-bit input connected to the digital input on the line 36, and an m-bit output on line 94 fed to a register 92 that comprises m flipflops. The resolution of the phase accumulator register may be selected to be very high. For example, it may be forty bits wide. The value in the register 92 is increased on each output clock period 16 with a numerical count on the line 36 that is proportional to the output synthesized frequency on the line 16. Normally, as mentioned above, the divider 86 in the feedback loop divides by N. However, when the adder 90 overflows, the divider ratio is temporarily changed to N+1. This causes the sawtooth type phase slip modulation on the signal line 76 and, in turn, on the signal line 78 from the phase detector 74 which must be compensated for. To accomplish the compensation, the k most significant bits (where k≦m) of the phase register 92 which also represent the sawtooth phase error on a line 96 (to an accuracy $\{1-2^{-k}\}$) as shown in a sawtooth phase error waveform 99 in FIG. 4C, is then subtracted from the signal on the line 78 in a subtracter 98. If k=4, the accuracy of the subtraction is approximately 0.94. For k=8, accuracy is approximately 0.996, etc. A sawtooth phase error waveform 100 is shown in FIG. 4D being representative of the signal on the line 81, i.e., the difference between the signal on the line 78 and the signal on the line 96. This then reduces the phase error on line 81 to:

$$\phi_e = T_{OUT}/2^k$$

which is further filtered by loop filter 82.

If, for example, the VCXO frequency is 10 MHz, and the upper 8 bits of the phase register are used in the sawtooth phase compensation circuitry, the resulting phase error on the line 81 is 100 ns/$2^8 \cong 0.4$ ns.

In order to achieve a reasonably low frequency at the output on line 16 of FIG. 4 it will sometimes be necessary to insert a divider circuit 101, as shown in FIG. 4A between the stable reference signal on the line 40 and the phase comparator 74. The divider 101 is illustrated as dividing the signal on line 40 by a value S. If the frequency of the stable reference were 10 MHz and the value of N in the divider 86 were greater than or equal to "ten," then without a divider 101, the output frequency on the line 16 would be greater than or equal to 100 MHz! With a divider 101 in the circuit of FIG. 4, we may say that $$\left[\frac{F_{OUT} - F_{carry}}{N}\right] = \frac{F_{STABLE\ REF.}}{S},$$

and rearranging, we get $$F_{OUT} = \left[\frac{N}{S} \cdot F_{STABLE\ REF.}\right] + [F_{carry}].$$

From FIG. 4, we can see that $$F_{carry} = \left[F_{OUT} \cdot \frac{M}{2^m}\right],$$

where M is equal to the value of the digital input word on the line 36. Substituting into the above expression for $F_{OUT}$, and rearranging, we obtain:

$$F_{OUT} = \frac{\frac{N}{S} \cdot F_{STABLE\ REF.}}{\left(1 - \frac{M}{2^m}\right)}$$

It should be understood that the selection of the size of the adder 90 and the register 92, the value or magnitude of the digital input signal on the line 36 that corresponds to the frequency of the signal on the line 12 of FIG. 1, and the selection of the output frequency on the line 16 will all determine the period of the sawtooth waveform 99 of FIG. 4 (as well as that of FIG. 6(a) to be described below).

Figure 5:
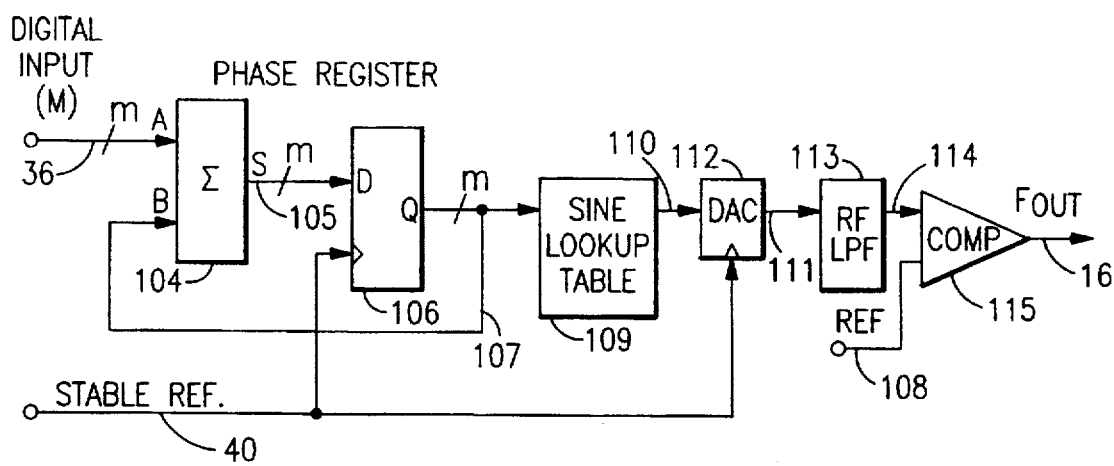
FIG. 5 shows another frequency synthesizer, according to the present invention, which may be used as the frequency synthesizer of FIG. 1.

FIG. 5 shows another embodiment of the frequency synthesizer 38 of FIG. 1, according to the present invention. There are commercial integrated circuits that can perform the function shown in FIG. 5 used according to the invention for the purposes of FIG. 1. For example, Analog Devices provides an 85 MHz Direct Digital Synthesizer (Part. No. AD9955) featuring a 32-bit Phase Accumulator with a 12-bit "sine" output that can be used as a frequency synthesizer such as the synthesizer 38 of FIG. 1. Such may be obtained from Analog Devices at One Technology Way, PO Box 9106, Norwood Mass. 01062-9106 USA. The digital numerical-controlled oscillator (NCO) or direct digital synthesis (DDS) technique that is shown in FIG. 5 allows a higher degree of digital integration than the fractional-N synthesizer method of FIG. 4. This technique of using a non-pullable reference oscillator in conjunction with a numerical controlled oscillator requires the use of a sine lookup converter, DAC, RF low pass filter and analog comparator. The block diagram of the commercial NCO that is shown in FIG. 5 could be used to replace a block 102 shown in FIG. 3. According to the invention, however, the device of FIG. 5 can also be used to replace the block 38 of FIG. 1.

In FIG. 5, there is also an adder 104 that provides an m-bit output on a line 105 to a phase accumulation register 106 also of arbitrary resolution (to generate an output frequency range with arbitrary resolution). A digital representation of the output frequency on the line 16 appears on a line 107 which is shown in FIG. 6(a) as a digitized sawtooth ramp waveform 107a with the same average frequency as $F_{OUT}$ but with a sampled phase granularity of $1/F_{REF}$ ($T_{STABLE\ REF}$), which would typically be chosen to be the non-pullable reference oscillator period, i.e. the same as the frequency of the signal on the line 40 of FIG. 5.

Figure 6A:
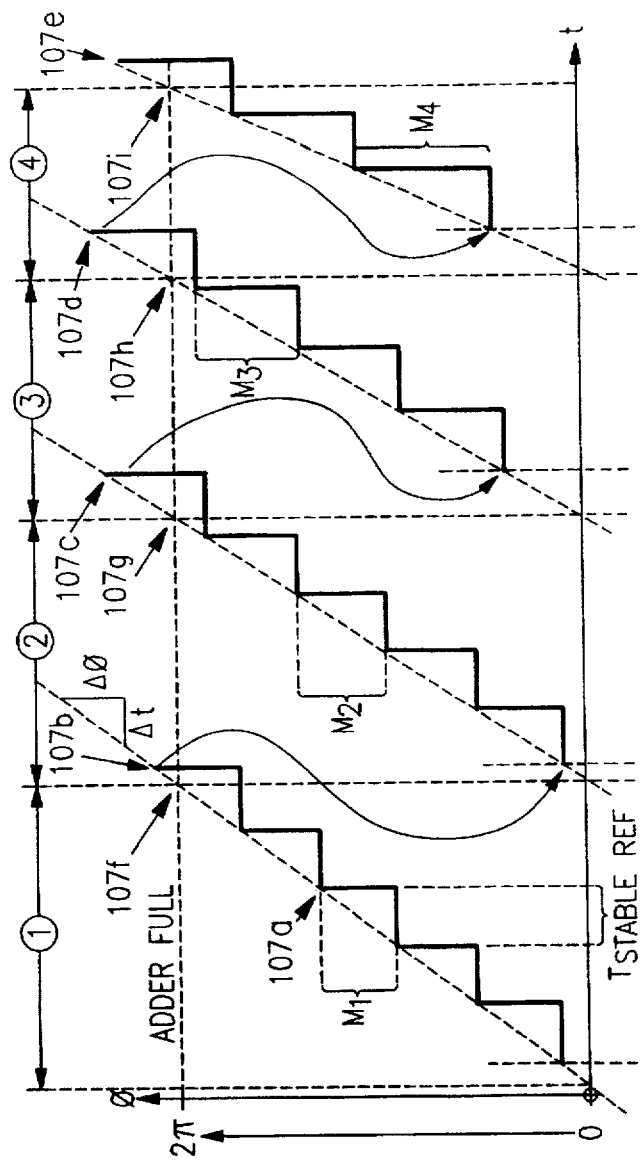

The sawtooth waveform 107a of FIG. 6(a) is a stylized representation of the signal on the line 107, for teaching purposes, and not exactly representative of the signal on line 107. By this is meant that four distinct, increasingly narrow time periods are shown to illustrate a digital input signal on the line 36 of FIG. 5 which is slowly becoming of higher frequency than the stable reference frequency on the line 40. Although this would be a gradual process in a real representation, it is assumed, for the teaching purposes of FIG. 6(a), that the signal on the line 36 of FIG. 5 has a fixed frequency in each of the periods 1–4 but which fixed frequency increases slightly in each of the periods from period 1 to period 4. In that case, the slope as illustrated by a Δ phase divided by a Δ time period becomes increasingly steep from period 1 through period 4. This would be manifested by the digital input signal on the line 36 having an increasing digital magnitude as signified by increasingly larger steps $M_1$–$M_4$.

It should also be pointed out that although the staircase steps are shown as being relatively large in size, they could be much smaller. We are showing approximately four samples per sine period in FIG. 6. This is adequate for design purposes, as only two to three samples per sine wave period are needed to accurately reconstruct the sinewave after filtering.

As will be observed in FIG. 6(a) a series of points in time 107b, 107c, 107d, 107e, representing points in time at which the adder 104 of FIG. 5 overflows and therefore a carry signal is generated, such points in time do not generally coincide with a respective ideal carry point in time 107f, 107g, 107h, 107i. No matter how high the resolution of the phase register of FIG. 5, there is no way to avoid some granularity due to the step nature of the measurement. Therefore, there will always be some small phase jitter generated as a result of this process. The phase jitter is shown for example in the difference between the point in time 107f and 107b as compared to the difference between the point in time 107g and 107c, and so on. Given the high frequencies involved, the phase error of the carry signal will have a high frequency jitter superimposed thereon due to this phenomenon.

Figure 6B:
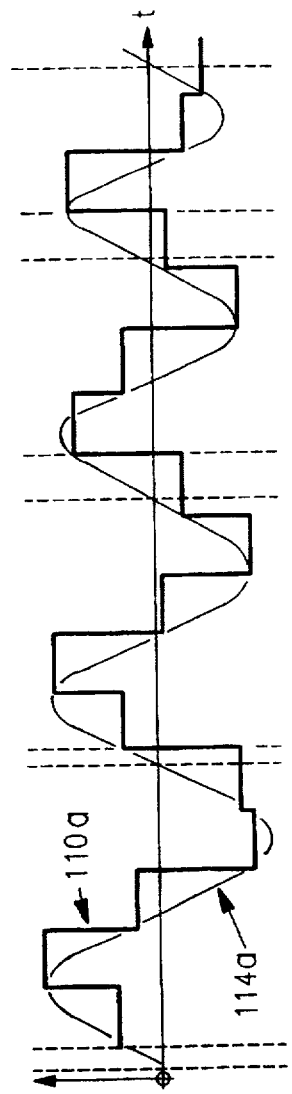

Again from FIG. 5, the digitized sawtooth ramp on the line 107 of FIG. 5 is passed through a sine lookup table 109, which generates 0–2π digital phase samples of a sine wave (1 sawtooth period=1 sinewave period) on a line 110 as shown by a waveform 110a in FIG. 6(b). The samples on the line 110 are converted to a voltage on a line 111 by a digital-to-analog converter (DAC) 112 which is further filtered by an RF lowpass filter (LPF) 113 to generate a clean sinewave on a line 114 as shown by a waveform 114a in FIG. 6(b). The RF LPF bandwidth and $F_{OUT}$ would typically be chosen to be less than $F_{REF}/2$. It should also be realized here that the loop filter could be omitted or changed, as discussed previously in connection with FIG. 4. Finally, a voltage comparator 115 compares the signal on the line 114 to a reference signal level on a line 108, e.g., zero volts, in order to convert the sinewave on the line 114 back to a digital signal on the line 16 with very low residual jitter as shown in a waveform 16a in FIG. 6(c). This method, while having a phase granularity of $1/F_{REF}$ ($T_{STABLE\ REF}$) in generating the voltage samples of a "pure" sinewave, relies on the lowpass filter 113 to restore very uniform zero crossings of the sinewave by filtering the high-frequency energy due to the sampling process. Even given the simplifications of FIG. 6, it will be seen from FIG. 6(c) and again from FIG. 6(e) that a very fine resolution output frequency on the line 16 can be achieved using the techniques of the present invention. Not only is fine resolution provided but also the local clock signal provided on the line 16 is extremely stable because it is referenced to the non-pullable oscillator 42 of FIG. 1.

FIG. 7 shows another frequency synthesizer, according to the present invention, which may be used as the frequency synthesizer 38 of FIG. 1. In FIG. 7, the digital input on the line 36, as shown emerging from the filter 20 of FIG. 1, is provided with m-bit resolution to an adder 120, which is also responsive to a signal on a line 122 from a phase register 124. The phase register 124 is responsive an m-bit resolution summed signal from the adder 120 on a line 126, which represents the sum of the current output of the phase register 124 on the line 122 and the digital input signal on the line 36, as clocked by the stable reference signal on the line 40 which may, for this example, have a frequency of 10.000 MHz. The adder 120 provides a carry output signal on a line 128 which is provided to a divider circuit 130 which may be a divide by N circuit, as shown, which provides a clock signal on a line 132 with some superimposed phase jitter illustrated in FIG. 7A similar to that explained previously in connection with FIGS. 5 and 6.

It is noted that the phase jitter of $F_{VCO}$ on the line 132 changes in amplitude over time, as shown in a waveform 134, depending on the phase relationship between the ideal carry positions 107f, 107g, 107h, 107i of FIG. 6(a) and the actual carry output on the line 128, as clocked by the stable reference signal on the line 40. FIG. 6(d) shows a waveform 128a representative of the actual carry position displaced from the ideal position of FIG. 6(a) by a phase error ($e_1$). Instead of varying in phase error in a smooth way as would be the case if an ideal adder were available, the phase error varies in a nearly random way as shown by some subsequent phase errors $e_2$, $e_3$, $e_4$, and so on.

After division by the divider 130, the phase jitter relative to an ideal $F_{OUT}$ is shown by the waveform 134 in FIG. 7. The phase jitter is approximately random for each $T_{REF}$ clock cycle, but with a maximum value of $T_{REF}$, and a minimum value of phase relative to the "ideal" carry position as shown in FIG. 6(d) and (e). In other words, the average value of the phase jitter shown by waveform 134 will be evidenced as shown in FIG. 6(e) by the leading edges of the pulses being in the middle of the range of potential phase error. As before, the small high frequency component of phase jitter will be filtered out by the low-cost phase-locked loop that follows as shown in a waveform 16b of FIG. 6(e). It will be observed that the leading edges 16c, 16d, 16e, 16f of the waveform 16b occur in the center of a band of potential phase error (jitter) corresponding to the period of the stable reference. The low cost phase lock loop of FIG. 7 averages the phase of the jittering carry signal to produce this result which is similar to the effect produced in the waveform of FIG. 6(c) except in a different way.

Thus, a phase comparator 136 is responsive to the signal on the line 132 and a feedback signal on a line 138 for comparison therebetween for providing an error signal on a line 140 to a loop filter 142. The loop filter provides a filtered signal on a line 144 to a voltage-controlled crystal oscillator 146 which in turn provides the output signal on the line 16 of FIG. 1. The signal on the line 16, in addition to being fed back to the phase detector 14 of FIG. 1, is also fed back to the phase detector 136 of FIG. 7, as shown. In FIG. 7, another divider circuit 148 is shown as a divide by P circuit being responsive to the output signal on the line 16 for providing a divided version thereof on the line 138 to the phase comparator 136.

The phase comparator 136, loop filter 142, voltage-controlled oscillator 146 and divider circuit 148 together make up a low-cost phase-locked loop which may have a bandwidth on the order of 90 Hz, may use a low-cost voltage-controlled crystal oscillator and provides frequency multiplication with numerically controlled oscillator (NCO) phase jitter filtering.

Referring now to FIG. 8, yet another embodiment of the frequency synthesizer of FIG. 1 is shown. As in FIG. 7, the digital input on the line 36 is provided to an adder 150 which also receives a signal on a line 152 from a phase register 154 each clock of the stable reference on the line 40, and is indicative of the rate of change of the magnitude of a signal on a line 156 from the adder 150.

In this case, a cycle stealer 158 is responsive to both the stable reference signal on the line 40 and a carry signal on a line 160 from the adder 150. Each time the carry signal on the line 160 is asserted, a cycle is "stolen" from the stable reference signal on the line 40, and thus an output signal on a line 162 from the cycle stealer 158 exhibits a waveform similar to that of the stable reference on the line 40, except having a pulse periodically "robbed" by the cycle stealer 158 each time the carry signal on the line 160 is asserted. When the signal on the line 162 is divided by a divider circuit 164, the clock pulses on a line 166 have a phase jitter superimposed thereon, as shown by a waveform 168 in FIG. 8A. This will be a periodic "ramp" for a particular cycle stealing rate. The "ramp" is shown with dots to indicate a sampled process. As the cycle stealing rate changes with different values of M on line 36, the ramp slope will change. This is similar to that described in connection with FIG. 7, as is the low-cost, phase-locked loop 170 comprising a phase comparator 172, a loop filter 174, a voltage-controlled oscillator 176 and a divider 178.

Figure 10:
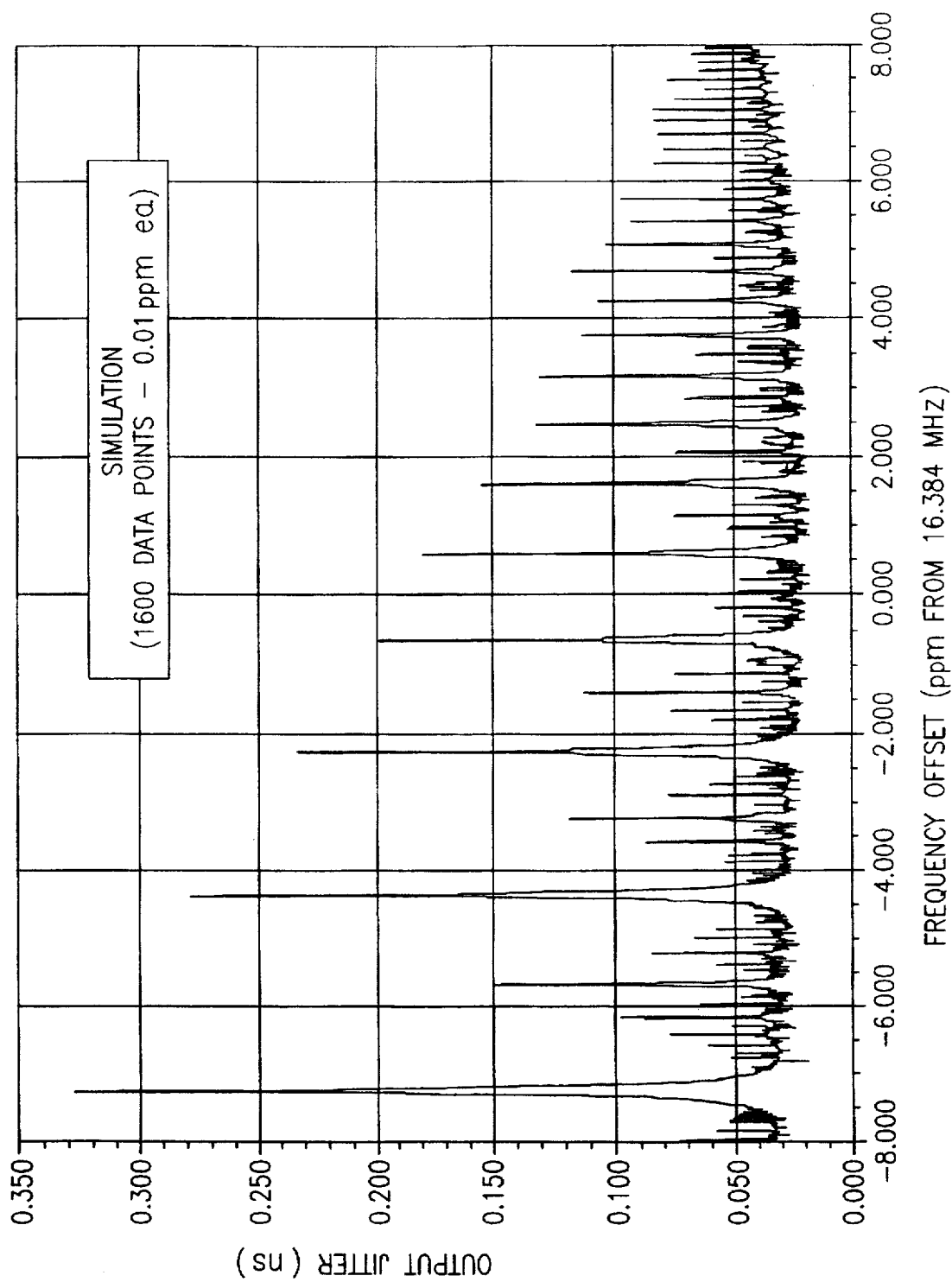
FIG. 10 shows a simulation of output jitter versus frequency offset from nominal, according to the present invention.
Figure 11:
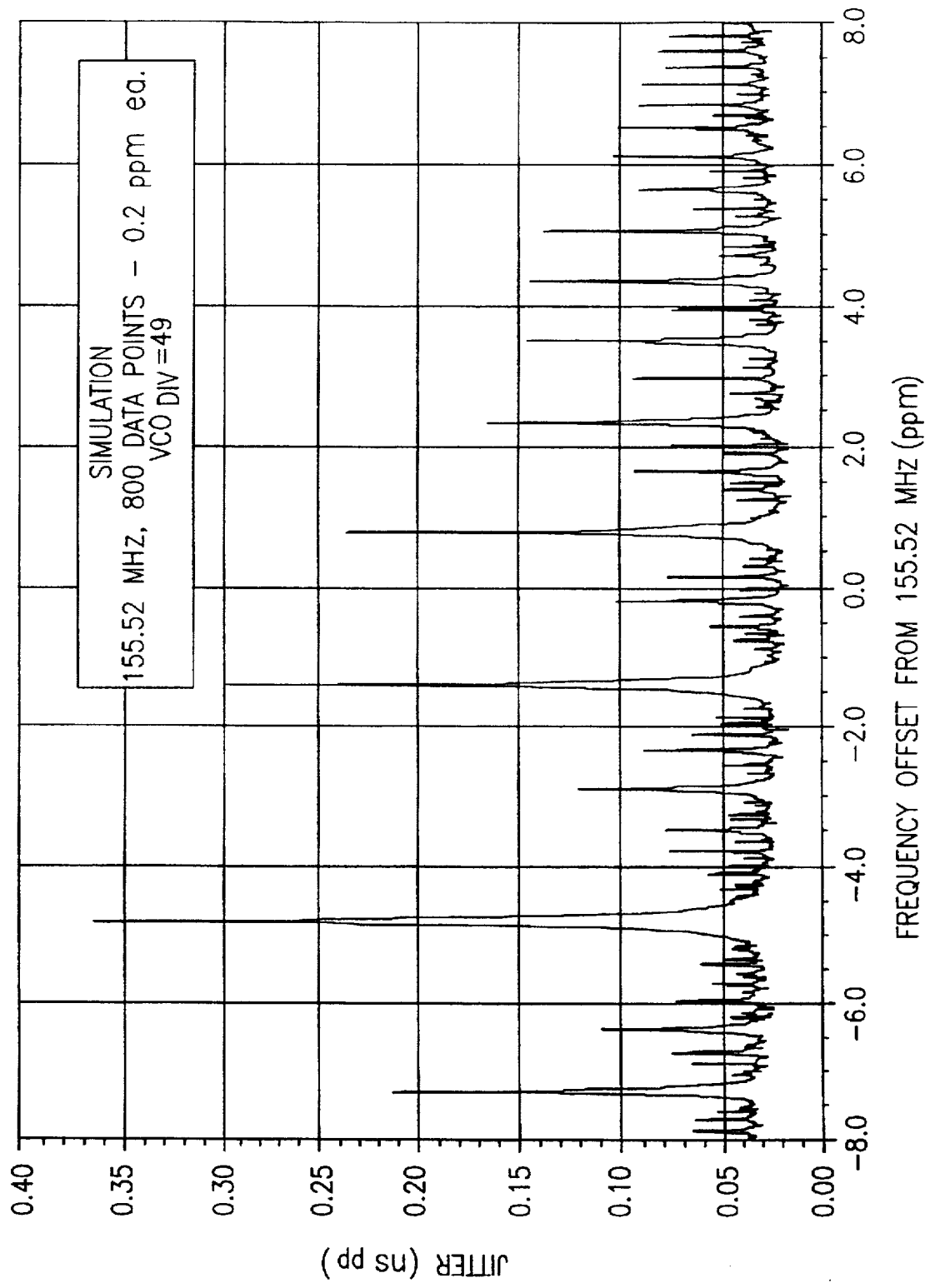
FIG. 11 shows another simulation of output jitter vs. frequency offset from nominal for a different synthesized frequency, according to the present invention.

The technique disclosed in FIG. 8 is digital NCO with cycle stealing. This technique is a variant of the technique of FIG. 7. The primary difference is that instead of synthesizing the output frequency from the adder carry signal, the adder carry signal is used to generate periodic gaps in the stable reference clock on the line 40 by means of a cycle stealer and the phase characteristics of the jitter of the two implementations. The period of the gaps in FIG. 8 is still controlled by the numerical count put into the adder at port A by the signal on the line 36, the width (number of bits m) of the phase accumulation register, and the clock rate $F_{REF}$ of the stable reference on the line 40. An additional divider divides by N and can be used to provide additional design flexibility. Thus, if a particular choice of the $F_{REF}$ of the stable reference and the output frequency range of $F_{out}$ of the signal on line 16 causes too much low frequency jitter (as determined, for example, by simulation), the divisor N can be changed, and a new nominal value on line 36 chosen to compensate, which will change the synthesized jitter characteristics. A subset of simulation results for FIG. 8 are shown in FIGS. 10 and 11.

Assuming, for example, that the stable reference on line 40 is at a stable frequency of 10 MHz, and assuming further that the carry output on the line 160 is at 169.6 KHz, the average output frequency of the cycle stealer will be the difference therebetween, i.e., 9.8304 MHz. If the value of N is 3, the average frequency of the signal on the line 166 will be 3.2768 MHz and, if the value of P=5, the average frequency of the output signal on line 16 will be 16.384 MHz. If the summer and phase register have a bit resolution of 40 bits, the value of the digital input on line 36 will nominally be the binary equivalent of the digital number 18.65 billion (approximate).

Figure 9:
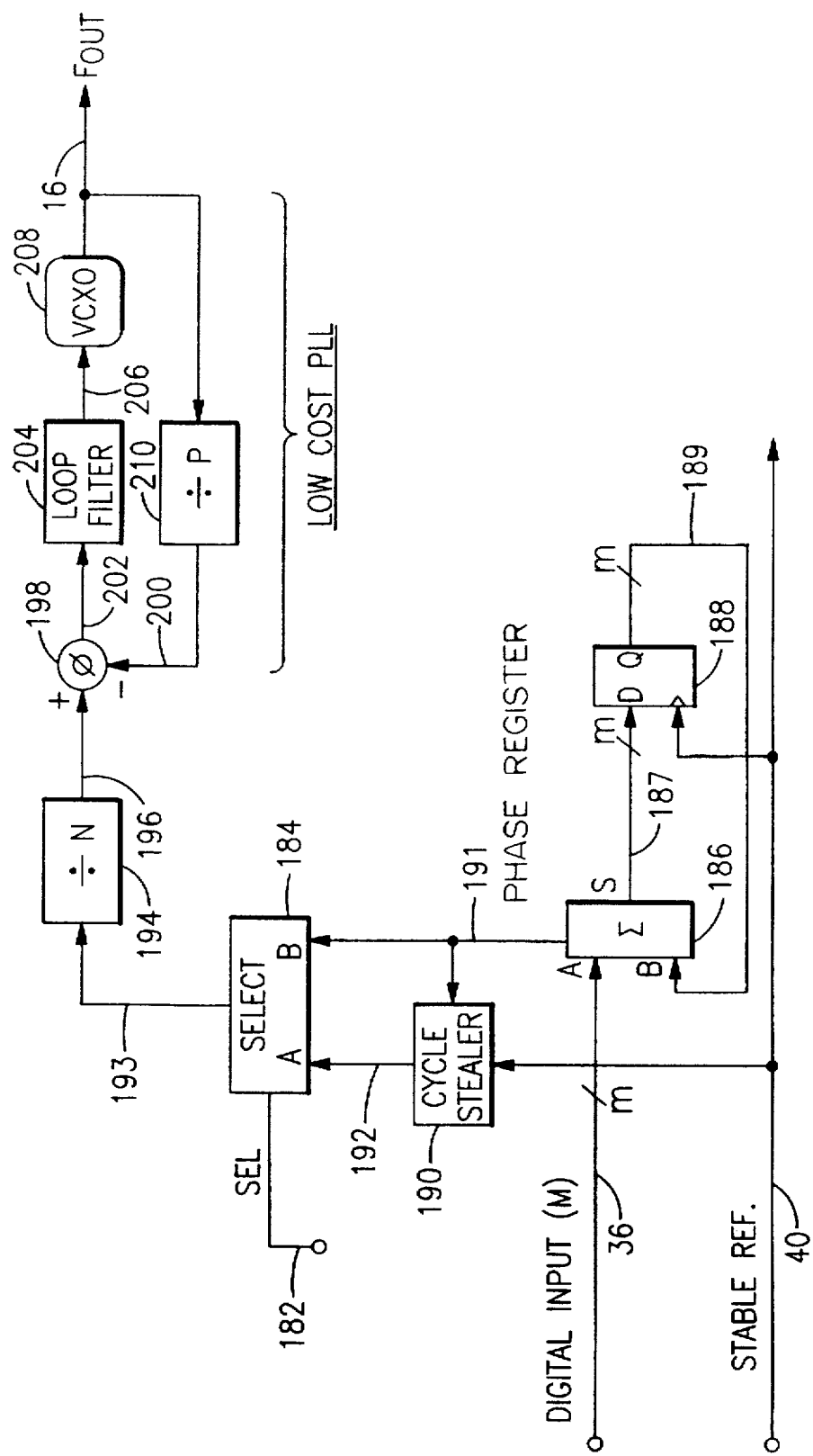
FIG. 9 shows still another frequency synthesizer, according to the present invention, which may be used as the frequency synthesizer of FIG. 1.

Turning now to FIG. 9, still another embodiment of the frequency synthesizer 38 of FIG. 1 is there shown. The input signal on the line 36 is the same as already described in connection with FIG. 1 as is the stable frequency input on the line 40. In this case, a select signal on a line 182 is used to select either the approach already described in connection with FIG. 7 above or the other approach having to do with "cycle stealing", as described in FIG. 8. This ability to select, for example, using a selector 184 that is able to select from between the technique of FIG. 7 using a summer 186 and a phase register 188 or the technique of FIG. 8 using a cycle stealer 190 allows great flexibility. Of course, it will be realized that similar approaches could be devised and also used in a multiple input selector for selecting from among a plurality of control mechanisms.

In FIG. 9, a phase register comprises a summer 186 and a register 188 both of m-bit resolution. A feedback signal on a line 189 is provided to the summer in order to provide the past value of the sum back into an input B of the summer 186. The digital input on the line 36 adds the value of M on each cycle of the stable reference. A cycle stealer 190 is responsive to both the stable reference on the line 40 and a carry signal on a line 191 from the summer 186. The carry signal steals a cycle of the stable reference on overflow of the summer. Depending on the magnitude of the select signal on the line 182, a select device 184 will provide either the signal on the line 192 or the signal on the line 191 as an output signal on a line 193 to a divider 194. A divided signal is then provided on a line 196 to a low-cost phase-locked loop comprising a phase comparator 198 which is responsive to the signal on the line 196 and a feedback signal on a line 200 for providing an error signal on a line 202 to a loop filter 204. This provides a low bandwidth cutoff of high-frequency jitter in a signal provided on a line 206 to a voltage-controlled crystal oscillator 208 which in turn provides the output signal on the line 16 for local clocking purposes and to a divider 210 for providing the signal on the line 200.

FIG. 10 shows a simulation to determine output jitter in relation to frequency offset from nominal, which is represented at the midpoint of the horizontal axis by zero. To the left and right of nominal are 800 data points spaced at 0.01 ppm. In other words, for a given set of assumptions in regard to digital input, phase register resolution, size of adder, stable reference frequency, output frequency, divider values, etc., the 1600 data point simulation of FIG. 9 shows output jitter that is achievable of less than 0.35 nanoseconds over a wide range of frequency offsets centering on 16.384 MHz (i.e., 1600 values of M on the line 36 of FIG. 9). A similar simulation is shown in FIG. 11 for frequency offsets from 155.52 MHz.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

I claim:

1. A method comprising the steps of:

comparing (14) a phase of a digital input signal (12) to a phase of a feedback output signal (16) for providing an error signal (18);

lowpass filtering (20) the error signal (18) for providing a filtered error signal (36);

providing a stable reference frequency signal (40); and frequency synthesizing (38) the feedback output signal (16) in response to the filtered error signal (36) and the stable reference signal (40);

wherein the step of frequency synthesizing comprises the steps of:

comparing (74) a phase of the stable reference signal (40) to a phase of a second feedback signal (76) for providing a second phase error signal (78);

comparing (98) the second phase error signal (78) to a phase accumulation modulation signal (96) for providing a reduced phase error signal (81);

filtering (82) the reduced phase error signal (81) for providing a filtered, reduced phase error signal (83);

providing (84) feedback the output signal (16) with a frequency that varies in proportion to the filtered, reduced phase error signal (83); and dividing (86) the output signal (16) by N, or by N+1 in response to a carry signal (88), for providing the second feedback signal (76).

2. The method of claim 1, further comprising the steps of:

summing (90) the filtered error signal (36) and the phase accumulation modulation signal (96) for providing a summed signal (94) and the carry signal (88); and storing (92) the summed signal (94) and for providing the phase accumulation modulation signal (96) in response to the feedback output signal (16).

3. Apparatus, comprising:

means for comparing (14) a phase of a digital input signal (12) to a phase of a feedback output signal (16) for providing an error signal (18);

means for lowpass filtering (20) the error signal (18) for providing a filtered error signal (36);

means (42) for providing a stable reference frequency signal (40); and means for frequency synthesizing (38) the feedback output signal (16) in response to the filtered error signal (36) and the stable reference signal (40), comprising:

means for comparing (74) a phase of the stable reference signal (40) to a phase of a second feedback signal (76) for providing a second phase error signal (78);

means for comparing (98) the second phase error signal (78) to a phase accumulation modulation signal (96) for providing a reduced phase error signal (81);

means for filtering (82) the reduced phase error signal (81) for providing a filtered, reduced phase error signal (83);

means for providing (84) the feedback output signal (16) with a frequency that varies in proportion to the filtered, reduced phase error signal (83); and means for dividing (86) the output signal (16) by N, or by N+1 in response to a carry signal (88), for providing the second feedback signal (76).

4. The apparatus of claim 3, further comprising:

means for summing (90) the filtered error signal (36) and the phase accumulation modulation signal (96) for providing a summed signal (94) and the carry signal (88); and means for storing (92) the summed signal (94) and for providing the phase accumulation modulation signal (96) in response to the feedback output signal (16).

* * * * *

UNITED STATES PATENT AND TRADEMARK OFFICE
CERTIFICATE OF CORRECTION

PATENT NO.  : 5,790,614
DATED       : August 4, 1998
INVENTOR(S) : W. Powell

It is certified that error appears in the above-identified patent and that said Letters Patent is hereby corrected as shown below:

On the title page
At INID [56], line 13, please cancel "Mollog" and substitute --Molloy-- therefor.

At column 11, line 54, after "method", please insert --,--; and at line 64, after "(40)", please cancel ":" and substitute therefor --;--.

Signed and Sealed this

Fifteenth Day of December, 1998

Attest:

BRUCE LEHMAN

Attesting Officer

Commissioner of Patents and Trademarks